United States Patent
Maris et al.

Patent Number: 6,087,242
Date of Patent: Jul. 11, 2000

[54] METHOD TO IMPROVE COMMERCIAL BONDED SOI MATERIAL

[75] Inventors: Humphrey John Maris, Barrington, R.I.; Devendra Kumar Sadana, Pleasantville, N.Y.

[73] Assignee: International Business Machines Corporation, Armonk, N.Y.

[21] Appl. No.: 09/031,289

[22] Filed: Feb. 26, 1998

Related U.S. Application Data

[60] Provisional application No. 60/046,793, Feb. 27, 1997.

[51] Int. Cl.$^7$ .................................................. H01L 21/76
[52] U.S. Cl. .............................. 438/406; 438/406; 117/85
[58] Field of Search ........................ 438/406, 16; 117/85; 437/63

[56] References Cited

U.S. PATENT DOCUMENTS

| | | |
|---|---|---|
| 4,710,030 | 12/1987 | Tauc et al. |
| 5,665,613 | 9/1997 | Nakashima et al. ............ 438/151 |
| 5,748,317 | 5/1998 | Maris et al. ..................... 356/357 |
| 5,786,231 | 7/1998 | Warren et al. ..................... 438/17 |
| 5,959,735 | 9/1999 | Maris et al. ..................... 356/381 |

*Primary Examiner*—Matthew Smith
*Assistant Examiner*—Calvin Lee
*Attorney, Agent, or Firm*—Scully, Scott, Murphy & Presser; Robert M. Trepp, Esq.

[57] ABSTRACT

A method of improving the bonding characteristics of a previously bonded silicon on insulator (SOI) structure is provided. The improvement in the bonding characteristics is achieved in the present invention by, optionally, forming an oxide cap layer on the silicon surface of the bonded SOI structure and then annealing either the uncapped or oxide capped structure in a slightly oxidizing ambient at temperatures greater than 1200° C. Also provided herein is a method for detecting the bonding characteristics of previously bonded SOI structures. According to this aspect of the present invention, a pico-second laser pulse technique is employed to determine the bonding imperfections of previously bonded SOI structures.

31 Claims, 5 Drawing Sheets

METHOD TO IMPROVE COMMERCIAL BONDED SOI MATERIAL

RELATED APPLICATIONS

This application claims the benefit of U.S. Provisional Application Serial No. 60/046,793 filed Feb. 27, 1997.

DESCRIPTION

This invention was made with government support under DE-FG02-86ER45267 awarded by the U.S. Department of Energy. The U.S. government thus has certain rights in this invention.

FIELD OF THE INVENTION

The present invention relates to bonded silicon on insulator (SOI) structures and, in particular, to a method of improving the bonding seam of previously bonded SOI structures. The method of the present invention comprises providing a previously bonded SOI structure; optionally, forming an oxide cap layer on said previously bonded SOI structure; and then subsequently heat treating the previously bonded SOI structure, with or without said oxide cap layer, at temperatures higher than 1200° C. in a slightly oxidizing ambient.

BACKGROUND OF THE INVENTION

In semiconductor manufacturing, silicon on insulator (SOI) structures are becoming increasingly attractive for low power, high performance complementary metal oxide semiconductor (CMOS) applications. A variety of SOI structures are presently available in the semiconductor industry. These SOI structures fall into two categories: SIMOX (separation by implantation of oxygen) and bonded SOI. There are three kinds of commercially available SIMOX materials: standard high dose ($1.6–1.8 \times 10^{18}$ cm$^{-2}$), medium dose ($0.8–1.2 \times 10^{18}$ cm$^{-2}$) and low dose ($0.3–0.7 \times 10^{18}$ cm$^{-2}$).

Similarly, there are three kinds of commercially bonded SOI structures: bonded and plasma thinned (acuthin), bonded and smartcut (Unibond) and bonded and etch back (Sibond). In each of the foregoing bonding techniques, it is preferred to have the bond seam away from the active Si region to minimize impact of bonding imperfections on devices and circuits built on the Si.

The temperature employed in prior art SOI bonding techniques is typically limited to temperatures below 1150° C. This is partly due to the availability of furnaces in the silicon fabrication line which are designed to operate at temperatures less than 1200° C. More importantly, however, is that previous findings have been reported which indicate that bonding perfection between Si and SiO$_2$ or two SiO$_2$ surfaces can be achieved at temperatures less than 1100° C. The characterization techniques employed in the prior art to determine the quality of the bonding process are conventional optical, infrared or acoustic microscopy, X-ray topography and TEM. Although these techniques can detect gross bonding defects, such as voids, they cannot determine the physical (roughness) and mechanical (bonding strength) properties of the interface.

U.S. Pat. No. 4,710,030 to Tauc, et al. describes an optical stress pulse generation and detection system for non-destructively measuring the physical properties of a sample. Specifically, the '030 patent utilizes a pump beam having short duration radiation pulses having an intensity and at least one wavelength selected to non-destructively generate a stress pulse in a sample and directs the non-destructive pump beam to a surface of a sample to generate the stress pulse. The '030 patent does not teach that the same can be employed in detecting the bonding imperfections of previously bonded SOI structures.

The presence of bonding imperfections in SOI structures can create a fixed charge either in the buried oxide region or in the silicon/buried oxide interfacial region. The presence of such a charge is undesirable because it can shift the threshold voltage of devices fabricated on this structure.

In view of the drawbacks mentioned hereinabove, there remains a need for providing a method which can be used to improve the bonding of previously bonded SOI structures so that the newly bonded SOI structure does not exhibit any bonding imperfections at the interface between the bonded silicon material and the insulating material.

SUMMARY

One object of the present invention is to provide a method of improving the bonding characteristics of previously bonded SOI structures so that little or no significant bonding imperfections are located at the interface between a silicon-containing material and an insulating material.

A further object of the present invention is to provide a detection method which can be used to determine whether any bonding imperfections exist at the interface between a silicon-containing material and an insulating material.

These as well as other objects and advantages are achieved in the present invention by utilizing a picosecond pulse laser technique to predetermine the degree of bonding imperfections present in a batch of previously bonded SOI structures. Specially, one previously bonded SOI structure of a batch is subjected to the pico-second laser technique and the information obtained therefrom is then applied to the remaining SOI structures of the batch. If bonding imperfections are found by the pico-second laser technique, the remaining wafers with bonded SOI structures of the batch are heat treated at temperatures higher than about 1200° C. in a slightly oxidizing ambient. In an optional embodiment of the present invention an oxide cap layer is formed on the surface of the bonded SOI structures and then subjected to the aforementioned heat treatment.

Specifically, the present invention provides a method to improve the bonding characteristics of a previously bonded SOI structure comprising the steps of:

(i) providing a bonded silicon on insulator (SOI) structure having bonding imperfections therein;

(ii) optionally, forming an oxide cap layer on said bonded SOI structure; and (iii) annealing either the structure provided in step (i) or (ii) at temperatures higher than about 1200° C. in a slightly oxidizing ambient.

When the detection method of the present invention is used in conjunction with the bonding method, the steps comprise:

(a) selecting one bonded silicon on insulator (SOI) structure from a master batch containing a plurality of bonded SOI structures;

(b) depositing a layer of a material capable of absorbing laser light on the surface of said one bonded SOI structure;

(c) pulsing the surface of the structure provided in step (b) with laser light under conditions effective to form a strain pulse which is transmitted through the structure until it reaches an interface, wherein at said interface a portion of said strain pulse is reflected back to the surface of said structure and the remainder of said strain pulse is transmitted through said interface;

(d) evaluating the change in an optical parameter of said partially reflected strain pulse and determining the degree of bonding imperfections in said one previously bonded SOI structure;

(e) subjecting each of the remaining bonded SOI structures of said batch to annealing under conditions effective to improve the bonding of said SOI structure.

In an alternative embodiment of the present invention, an oxide cap layer is formed on each of the remaining SOI structures by heating the same in oxygen at a temperature of from about 900° to about 1200° C. prior to annealing.

It is noted that steps (a)–(d) represent the detection technique employed in the present invention to determine the physical and mechanical properties of any interfaces that may exist in a batch of previously bonded SOI structures that are purchased from a vendor. A poorly bonded interface gives rise to multiple reflections whereas a good bonded interface shows either no or very few reflections. Steps (a)–(d) thus can be used after step (e) mentioned above to determine the effectiveness and efficiency of the newly bonded heat treated SOI structures. Again one of the heat treated bonded SOI structures of the batch is selected and is used as described above in steps (b)–(d).

It is further noted that by employing the optional oxide layer formation step and the heat treatment step as indicated by (ii)–(iii) above, the bonding imperfections present in the previously bonded SOI structure can be either eliminated or significantly improved. Without wishing to be bound by any theory, it is believed that the improvement in bonding that is achieved by the present invention occurs by a combination of the following events: outdiffusion of trapped gases leading to increased bonding area; improvement in Si-O atomic bonding; and increased oxide flow at the bonding interface.

BRIEF DESCRIPTION OF THE DRAWINGS

FIG. 3($b$) represents the acoustic component of the data in FIG. 3($a$).

DETAILED DESCRIPTION OF THE INVENTION

Figure 1:
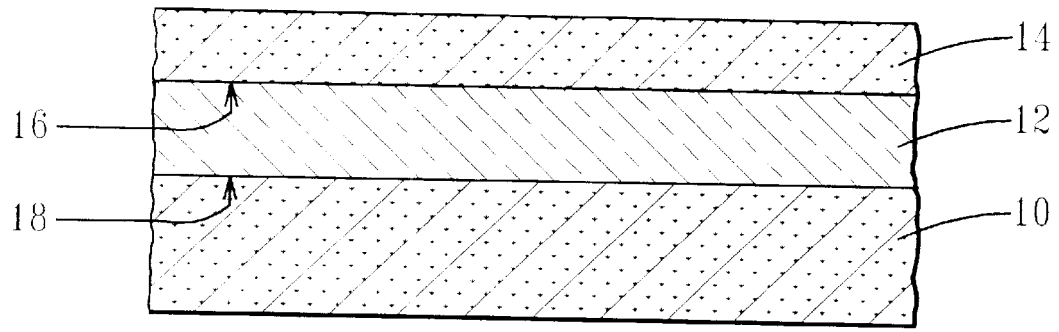
FIG. 1 is a cross sectional view of a typical SOI structure that can be employed in the present invention.

The present invention which provides a method for improving the bonding characteristics of previously bonded SOI structures as well as a method of detecting bonding imperfections in such structures will now be described in more details with reference to the accompanying drawings wherein like reference numerals are used for like and corresponding elements of the drawings.

Referring first to FIG. 1, there is shown a bonded SOI structure that can be employed in the present invention. Specifically, the bonded SOI structure includes a silicon-containing substrate 10, an insulator layer 12 on top of silicon-containing substrate 10, and a silicon-containing layer 14 on top of said insulator layer 12. A first interface 16, between layers 14 and 12, and a second interface 18, between layer 12 and substrate 10 are shown in FIG. 1. Depending on the bonding method employed by the vendor, imperfections in the bonded structure may exist at first interface layer 16, at second interface 18, or in between interfaces 16 and 18. For simplicity, these imperfections are not illustrated in the drawings of the present invention.

The bonded structure shown in FIG. 1 can be fabricated using any of the conventional bonding techniques that are well known to those skilled in the art. This includes, for example, bonding and plasma thinning (acuthin), bonding and smartcutting (Unibond) and bonding and etching back (Sibond).

The silicon-containing substrate that may be employed in the present invention is composed of conventional materials such as silicon, $SiO_2$ or an alloy of Si/Ge. Substrate 10 may be doped or undoped depending upon the type of device being manufactured from the bonded SOI structure. A highly preferred silicon-containing substrate that can be employed in the present invention is silicon (Si).

Suitable insulators which comprise layer 12 include, but are not limited to: $SiO_2$, Si oxynitride, $SiO_2$, diamond-like carbon, $Si_3N_4$, $Al_2O_3$ and the like. A highly preferred insulator employed in the present invention is $SiO_2$.

The silicon-containing layer 14 that can be employed in the present invention may be composed of the same or different material as the silicon-containing substrate. A highly preferred silicon-containing material that is employed, as layer 14, is Si or SiGe.

When the detection method of the present invention is employed, one bonded SOI structure from a master batch containing a plurality of bonded SOI structures is selected and a thin layer of material 22 capable of absorbing laser light (See FIG. 2) is deposited on silicon-containing layer 14 of said one bonded SOI structure using techniques and conditions well known to those skilled in the art. Whichever technique is employed, it must be capable of depositing a layer that has a thickness of from about 2 to about 100 nm. More preferably, the deposition technique should be capable of providing an absorbing material layer having a thickness of from about 5 to about 40 nm.

For example, material layer 22 can be deposited by chemical vapor deposition, thermal evaporation, sputtering, electroplating, electroless plating and the like. As stated above, layer 22 is any material that is capable of strongly absorbing laser light. Suitable materials include, but are not limited to:

metals such as Al, Ti, Cu, Cr, W and the like as well as semiconductor materials such as Ge or GaSb. A highly preferred material employed in the present invention as layer 22 is Al.

If the deposition technique deposits more absorbing material than recited above, it can be thinned by using standard etching or chemical-mechanical polishing techniques.

The thin layer of absorbing material, e.g. Al, is employed in the present invention as an internal transducer which is capable of detecting various strain pulses (or shock waves) generated by a picosecond laser pulse. The absorbing material-containing structure as well as the pico-second laser pulse technique employed in the present invention are shown in FIG. 2.

Figure 2:
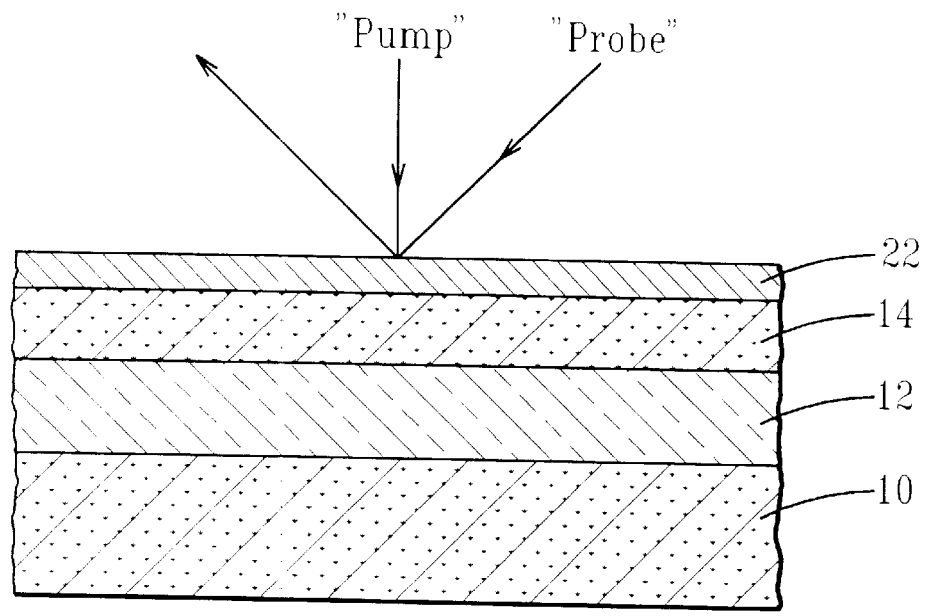
FIG. 2 is a schematic diagram of the detection method employed in the present invention on previously bonded SOI structure from a master batch.

As is shown in FIG. 2, the absorbing material-containing structure is pulsed with laser light under conditions which are effective to form a strain pulse which is subsequently transmitted through the structure until it reaches an interface. When the strain pulse reaches an interface the following occurs: one portion of the strain pulse is reflected back to the surface of the structure and another portion of the strain pulse is transmitted through the interface. The strain pulse transmitted through the interface travels to the next interface and that strain pulse is partially reflected and transmitted through the interface as indicated above.

The strain pulse is generated in the present invention by utilizing a sequence of sub pico-second light pulses ("pump" pulses). The wavelength of light employed as the pump pulse is typically of from about 100 to about 10,000 nm. More preferably, the wavelength of light utilized in the present invention to generate the strain pulse is from about 200 to about 1000 nm.

The pulse energy employed in the present invention to generate the strain pulse is from about 0.001 to about 10,000 nJ and the repetition rate is from about 0.001 to about 1000 MHZ. More preferably, the pulse energy employed in the present invention is from about 0.1 to about 10 nJ and the repetition rate is from about 1 to about 100 MHZ.

It is emphasized that the above conditions cause heating of the absorbing material which results in the development of subsequent thermal stress in the structure. This induced thermal stress, in turn, results in a strain pulse which is transmitted into the bonded SOI structure.

As stated above, when the strain pulse reaches an interface within the bonded SOI structure, it is partially transmitted and partially reflected. When the reflected component of the strain pulse returns to the surface of the absorbing film, it causes a small change in the optical reflectivity, $\Delta R$, of the film. In accordance with one embodiment of the present invention, this change in optical reflectivity is measured with a second light pulse (the "probe"), which is time-delayed with respect to the first light pulse used in generating the strain pulse.

The small change $\Delta R$ in the optical reflectivity of the film is one way of measuring the change in the returning strain pulse. There are a number of possible variations of the optical measurement technique that can be employed. Specifically, the measurement can be made through the determination of the small change in (i) the polarization of the reflected probe light, (ii) the change in direction of the reflected probe light, or (iii) the change in the optical phase of the reflected probe light. Yet another possibility is to use a "grating" technique for generation and detection. The pump light before being incident on the sample can be divided into two beams which are then directed onto the surface of the sample at different angles. Because of the interference between the two beams the optical intensity will vary periodically across the surface of the sample. As a result the amplitude of the strain pulse that is generated will also vary periodically across the sample surface. Because of this variation in amplitude, when the strain pulse returns to the absorbing material on the bonded SOI surface there will be a variation in the optical properties of the structure across the bonded SOI surface. This variation amounts to a surface diffraction grating. Thus when the probe light is directed at the bonded SOI surface a portion of the probe light will be diffracted and can be detected by a suitably-placed optical detector such as a photo-multiplier. The output S(t) of the photo-multiplier as a function of the time delay, t, between the pump and the probe can be used to determine the amplitude and wave form of the returning strain pulse.

The second light pulse which is employed in the present invention as the probe may have the same wavelength and energy as that used in generating the strain pulse, or may have a different wavelength and energy. In order to be employed as a probe however it is pulsed from about 0.1 to about 10,000 picoseconds after the first light pulse.

When optical reflectivity is utilized as the measurements means, the magnitude of the fractional change in optical reflectivity, $\Delta R/R$, is typically in the range of $10^{-6}$ to $10^{-4}$. To improve the signal-to-noise ratio, the second light beam is modulated at about 0.001 to about 100 MHZ with an acousto-optic modulator and the output from the detector of the reflected probe light signal is passed through a lock-in amplifier. For simplicity, the modulator and amplifier are not shown in FIG. 2.

Figure 3A:
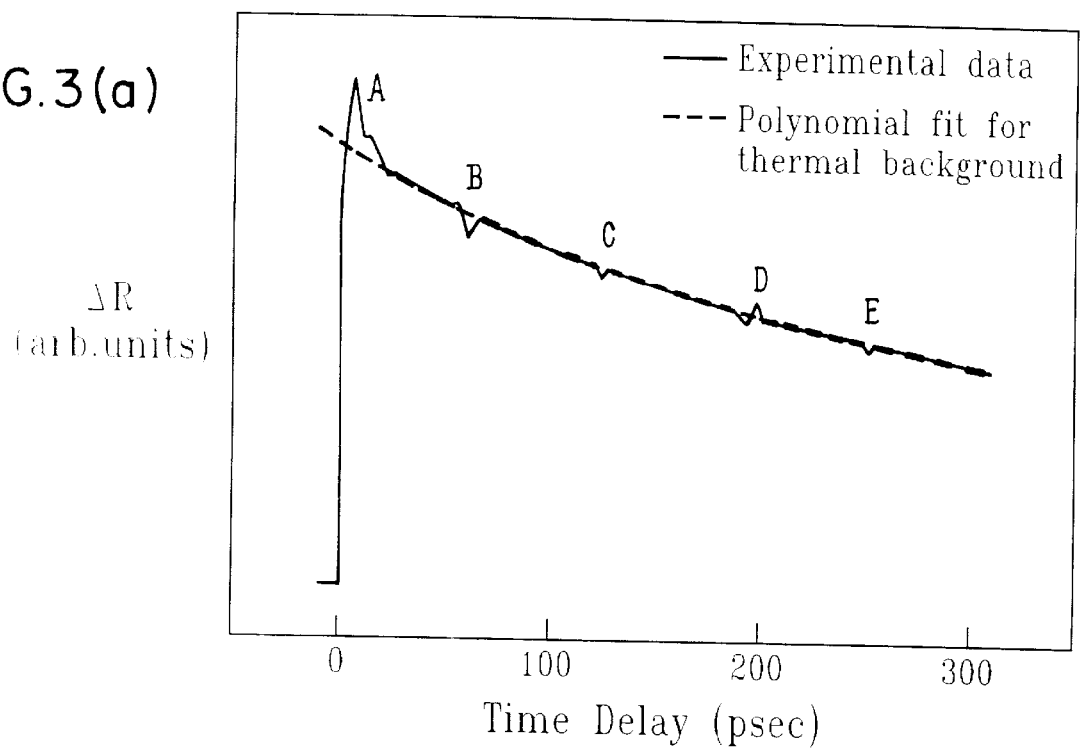
FIG. 3($a$) is a plot of change of reflectivity, $\Delta R$, as a function of time delay (pico-seconds) of a typical bonded SOI structure.

FIG. 3(a) shows a typical response using the picosecond laser detection method of the present invention. It is understood as the sum of two components. The first component consists of a sudden increase in $\Delta R$ immediately after time zero, followed by a slow relaxation. This component comes about because the reflectivity of the absorbing material changes with temperature. The first light pulse, which generates the strain pulse, produces a sudden increase in temperature of the absorbing material, and thereafter the absorbing material slowly cools as heat flows into the structure.

Figure 3B:
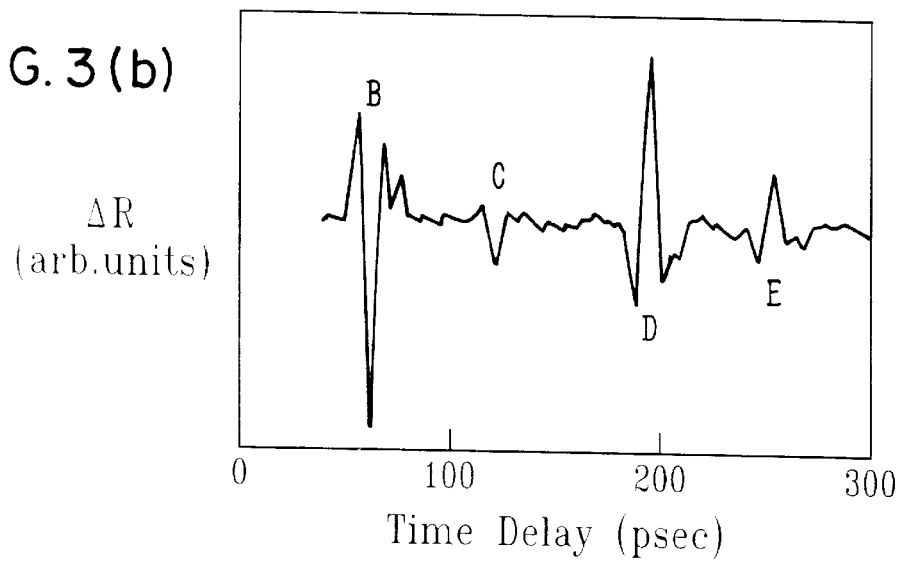

The second component is the acoustical part which arises from the effect of the propagating strain pulse. Since the acoustic part is the desired part of the response, the thermal background from the original data is subtracted therefrom. The subtracted data is shown in FIG. 3(b). In FIG. 3(a), the oscillation A comes from the strain pulse generated in the absorbing material and partially reflected back because of the difference in acoustic impedance between absorbing material and Si. The echo B comes from the strain pulse which has been reflected at the first Si—$SiO_2$ interface. The echo C arises from a strain pulse which has made two round trips inside the SOI layer. Echo D arises from the part of the strain pulse which is transmitted across the first interface and is then reflected at the second interface, i.e., the interface between the $SiO_2$ and Si substrate and Echo E is the combination of two pulses which arrive at the same time. One pulse has been reflected at the first Si—$SiO_2$ interface, returned to the absorbing material, and then reflected at the second Si—$SiO_2$ interface. The other is a pulse reflected first from the second interface and then from the first interface.

From the arrival times of the echos in FIG. 3, the thickness of the SOI layer and any buried oxide (BOX) layer can be determined. The results generated using the picosecond laser detection method of the present invention are in excellent agreement with those obtained from spectroscopic ellipsometry. Moreover, the shapes and amplitudes of the echos give information about the mechanical properties of the interfaces and the roughness of the BOX regions. For an ideal interface, i.e., a sharp and flat interface with perfect bonding, it is straight forward to calculate the acoustic reflection coefficient in terms of the densities and sound velocities for the two adjacent materials utilizing the equations and calculations found in B. A. Auld, Acoustic Fields and Waves in Solids, 2nd Ed, Vol. I, 129–130 (1990). Imperfect bonding will cause the acoustic reflection coefficient to depart from the ideal value. Interfacial roughness leads to a modification in the shape of the echo.

For a quantitative analysis of the experimental data, a simulation program is employed to model the generation, propagation and detection of the strain pulses. Because the area of the sample that is illuminated by the pump and probe pulses is large compared to the thickness of the Si and $SiO_2$ layers, it is a good approximation to assume that the strain depends only on the distance z into the sample. The first step is to divide the structure into many thin sublayers, the n-th sublayer comprising the material between $Z_n$ and $Z_{n+1}$. Next the optical constants in each layer of the structure are used to calculate the heat deposited and the temperature rise in each sublayer. From this heat distribution, the stress built up in the structure can be determined as a result of the absorption of the pump pulse. Next the acoustic reflection and transmission coefficients between adjacent layers are calculated using an appropriate algorithm to time resolve the strain distribution in the structure. Finally, for each time step, calculations are made from the strain distribution $\rho(z)$, the optical constants n and κ, and the derivatives dn/dρ and dn/dρ, the strain-induced changes in the optical reflectivity for the probe. The simulation assumes that the phonon attenuation varies as $\omega^2$. To simulate the effect of interfacial roughness, the average result over a large number of structures with different thickness for the Si and $SiO_2$ layers is employed. In this ensemble, the thickness of the Si and $SiO_2$ layers are each chosen from Gaussian distributions with characteristic widths. The widths of these distributions are then associated with the roughness. For most of the samples that have been studied in the present invention, the characteristic width for each layer is about 20 to 30 Å.

If bonding imperfections are determined to be present in one of the previously bonded SOI structure of the master batch, the remaining structures of the master batch are then subjected to the following: an optional step of forming an oxide cap layer on the structure; and then annealing either the bonded SOI structure containing no oxide cap layer or the bonded SOI structure containing the oxide cap layer. By employing the foregoing, a SOI structure having improved bonding characteristics is obtained.

As stated above, an oxide cap layer may optionally be formed on a bonded SOI structure having bonding imperfections by heating the same in oxygen at a temperature of from about 900° to about 1200° C. for a period of time of from about 10 minutes to about 4 hours. More preferably, the cap layer is formed by heating at a temperature of from about 1000° to about 1100° C. for a time period of from about 30 to about 60 minutes.

Although it is preferred to use pure oxygen (100%), the oxide cap layer can be formed by using a gas mixture which contains from about 10 to about 90% $O_2$ and the remainder being an inert gas such as Ar or $N_2$.

Using the above defined conditions, an oxide cap layer having a thickness of from about 20 to about 200 nm is formed in the SOI structure. More preferably, an oxide cap layer having a thickness of from about 50 to about 100 nm is formed by utilizing the above parameters.

The bonded SOI structure either containing an oxide cap layer or not is then annealed under conditions effective to improve the bonding of the previously bonded SOI structure. In accordance with the present invention, the anneal step is conducted at temperatures greater than 1200° C. in a slightly oxidizing ambient. By "slightly oxidizing ambient" it is meant an ambient which contains from about 0.2 to about 5% $O_2$, and the remainder being an inert gas such as $N_2$ or Ar. More preferably, annealing is conducted in an ambient containing from about 0.5 to about 2% $O_2$ and the remainder being an inert gas.

The annealing step employed in the present invention is preferably carried out at a temperature of from about 1250° to about 1375° C. for a time period of from about 2 to about 24 hrs. More preferably, the annealing step is carried out at a temperature of from about 1300° to about 1320° C. for a time period of from about 5 to about 10 hrs.

As stated above, the pico-second laser pulse technique can be employed as a very powerful and nondestructive method to characterize the bonding quality of previously bonded SOI structures. Moreover, by employing the pico-second laser pulse technique of the present invention, any bonding imperfection within the BOX region can be detected and eventually eliminated by further annealing. Additionally, by employing the steps of the present invention, the bonding strength of previously bonded SOI structures can be significantly enhanced.

The following examples are given to illustrate the scope of the present invention. Because these examples are given for illustrative purposes only, the invention embodied therein should not be limited thereto.

EXAMPLE 1

In this example, the picosecond laser pulse technique was employed to determine the bonding imperfections that are present in four commercially bonded SOI structures.

Each of the four previously bonded SOI structures were subjected to the picosecond laser detection method of the present invention. Specifically, an Al film having a thickness of about 40 nm was deposited on to each bonded SOI structure by sputtering. Following deposition of the Al film, each structure was subjected to a first laser pulse of light (wavelength 800 nm) using an energy of about 1.3 nJ and a repetition rate of about 76 MHZ. These conditions are sufficient to produce a strain pulse which can be transmitted through the SOI structure. A second laser pulse of the same wavelength and energy is employed as the probe.

Figure 4:
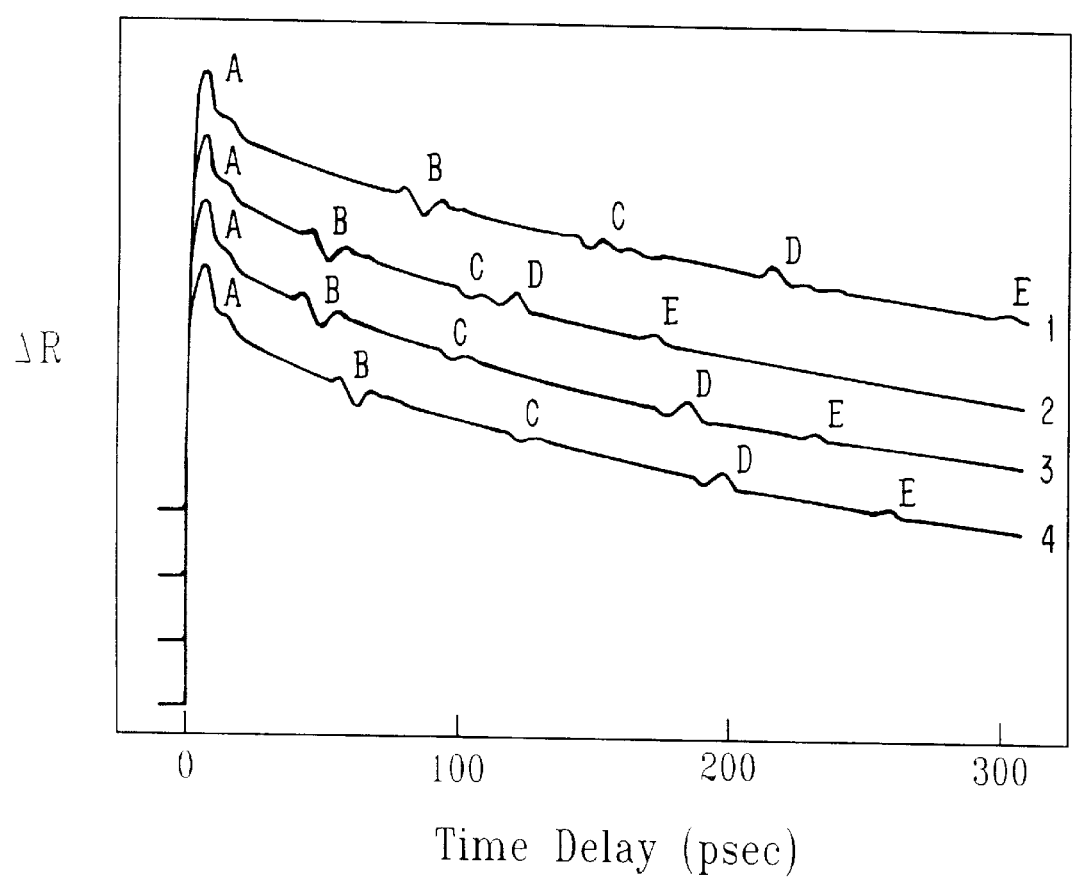
FIG. 4 is a plot of $\Delta R$ vs. time delay comparing the bonding characteristic of four commercially available bonded SOI structures.

The results of this experiment is shown in FIG. 4. The echos A, B, C, D and E are defined in the same way as in FIGS. 3(a) and (b). The different arrival times of the echos in FIG. 4 are the result of different thickness of SOI and BOX layers from the different vendors. The shapes of echos C and D for the bonded SOI structure from vendor 1 are very different from those of the other three structures. This indicates a bonding or interfacial imperfection. The results for the bonded SOI of vendors 2, 3 and 4 are very similar. Those bonded SOI structures do not have any anomalous features.

From the bonded SOI structures from vendors 2, 3 and 4 which are bonded on one side of the Si—$SiO_2$ interfaces, it was determined that the bonding is generally much better than the bonding of the middle of the BOX. This result agrees with the tensile strength tests.

EXAMPLE 2

In this example, the effects of annealing on the bonded SOI structures of Example 1 were investigated. FIG. 5 shows the results of different annealing processes of a bonded SOI structure from vendor 1. FIG. 4(a) is the data for the sample which did not undergo any further annealing. FIG. 4(b) is the result from the same sample after further annealing at 1150° C. for 6 hours. FIG. 4(c) shows the result after annealing the sample at 1320° C. for 6 hours. The echoes B, C, D and E are defined in the same way as in FIG. 3. In this example, the echos have shifted to earlier times in (b) and (c) compared to (a) because during the annealing, an oxide layer has formed on the surface of the SOI layer and this reduces the thickness of the Si. In these experiments, the oxide layer formed on top has been removed by dipping the samples into 49% HF solution after each annealing and before the deposition of the Al film. From FIG. 5 a trend due to the thermal annealing is observed. Specifically, the amplitudes of echoes B, C and D decrease when the annealing temperature increases. Also the oscillations at the ends of those echoes become less noticeable in FIG. 5(b) and finally disappear in FIG. 5(c).

Figure 5A:
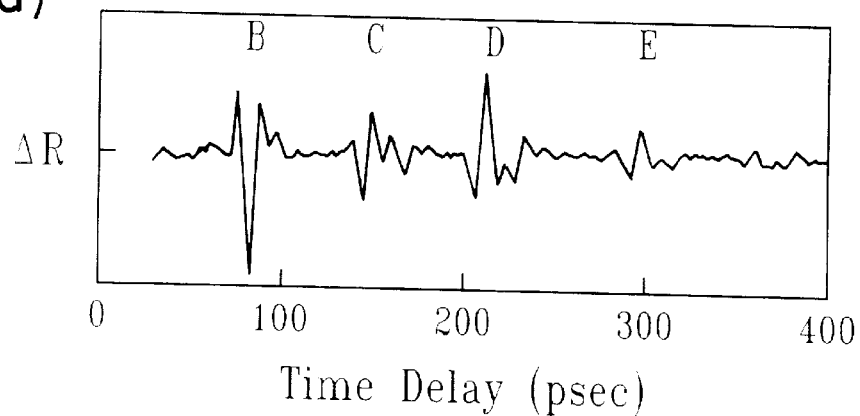
FIG. 5 is a plot of $\Delta R$ time delay investigating the effects of further annealing: ($a$) no further annealing; ($b$) annealing further at 1150° C. for 6 hrs; and ($c$) annealing further at 1320° C. for 6 hrs.
Figure 5B:
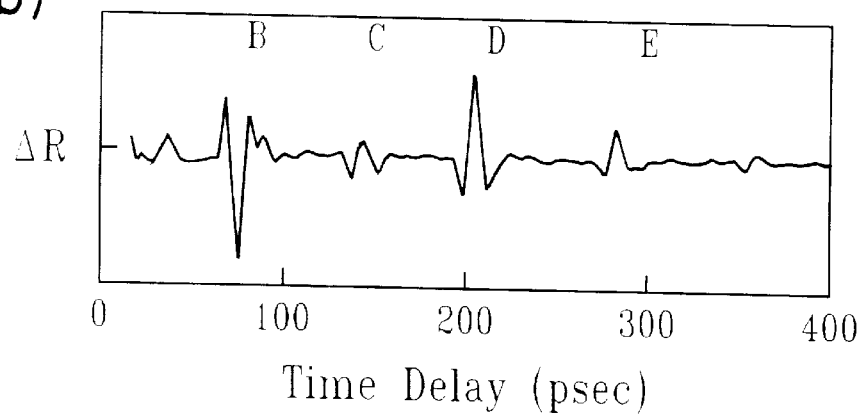
Figure 5C:
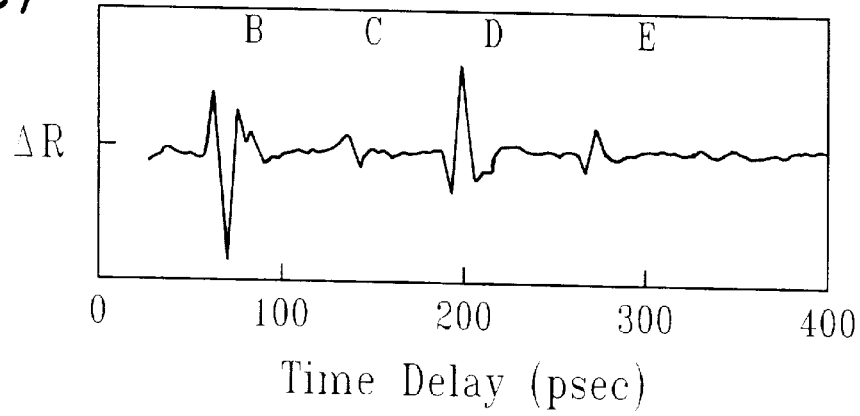
Figure 6:
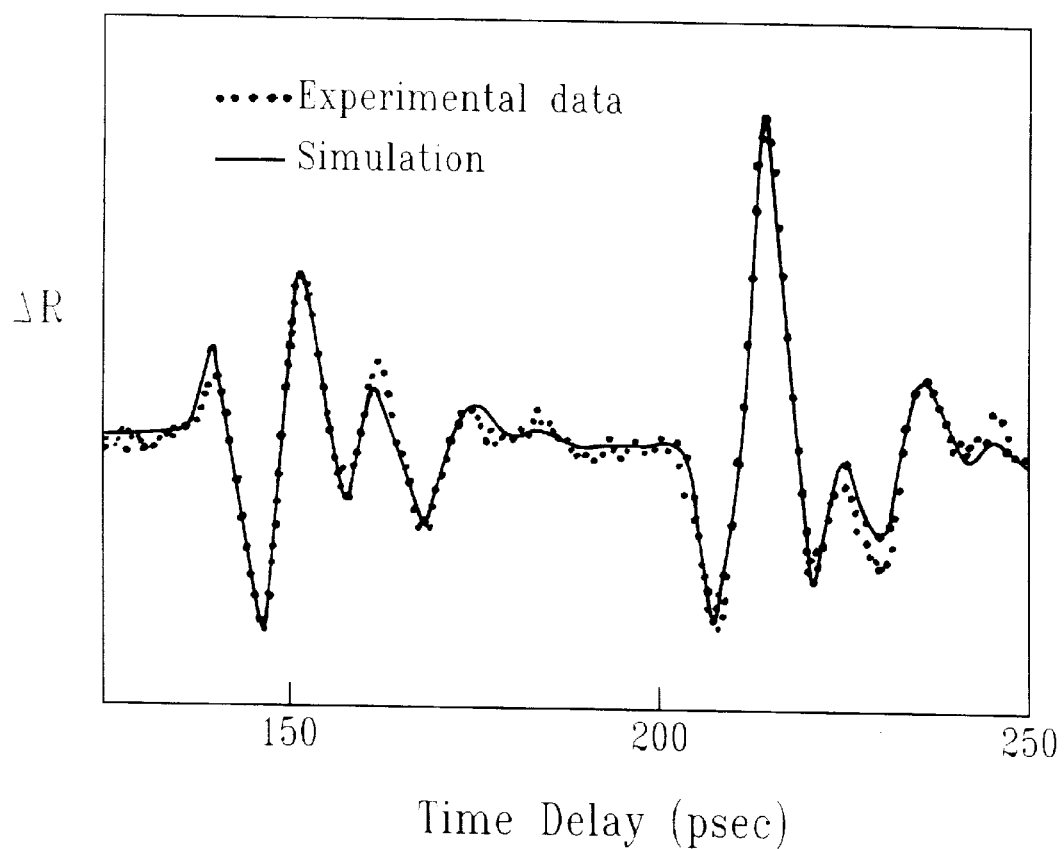
FIG. 6 is a computer simulation for the data in FIG. 5($a$).

FIG. 6 shows the results of a simulation of the data in FIG. 5(a). The time range includes echoes B and C. To simulate the shapes and amplitudes of the echoes, an extra thin layer of 'softer' material with lower density and lower sound velocity was inserted into the middle of the BOX region. This result indicates that this BSOI structure is made via bonding two $SiO_2$ surfaces together, thus producing a bonded interface in the BOX at approximately 2000 Å from the Si substrate. This data can also be used to interpret the 'oscillations' at the end of echoes B, C and D, as echoes reflected from this bonded interface and getting mixed up with the original echoes B, C and D which arrive at roughly the same time as these extra echoes. The changes from FIG. 5(a) to FIG. 5(c) shows that the bonding has been gradually improved.

While the invention has been particularly shown and described with respect to preferred embodiments thereof, it will be apparent to those skilled in the art that the foregoing and other changes in form and detail may be made without departing from the spirit and scope of the present invention.

Having thus described our invention, what we claim is new, and desire to secure by the Letters Patent is:

1. A method to improve the bonding characteristics of a bonded silicon on insulator (SOI) structure comprising the steps of:
   (i) providing a bonded SOI structure having bonding imperfections therein;
   (ii) optionally, forming an oxide cap layer on said SOI structure; and
   (iii) annealing either the structure provided in step (i) or (ii) at a temperature higher than about 1200° C. in a mixture of oxygen and an inert gas, said annealing providing improved bonding of said bonded SOI structure.

2. A method to improve the bonding characteristics of a bonded SOI structure comprising the steps of:
   (a) selecting one bonded silicon on insulator (SOI) structure from a master batch containing a plurality of said bonded SOI structures;
   (b) depositing a layer of a material capable of absorbing laser light on a silicon-containing surface of said bonded SOI structure;
   (c) pulsing the surface of the structure provided in step (b) with laser light under conditions effective to form a strain pulse which is transmitted through the structure until it reaches an interface, wherein at said interface a portion of said strain pulse is reflected back to the surface of said structure and the remainder of said strain pulse is transmitted through said interface;
   (d) evaluating the change of an optical parameter of said partially reflected strain pulse and determining the degree of bonding imperfections in said bonded SOI structure;
   (e) subjecting the remaining bonded SOI structures of said master batch to annealing at a temperature higher than about 1200° C. in a mixture of oxygen and an inert gas, said annealing providing improved bonding of said bonded SOI structure.

3. The method of claim 2 wherein prior to said annealing an oxide layer is formed on each surface of the remaining bonded SOI structures.

4. The method of claim 1 wherein said bonded SOI structure comprises a silicon-containing substrate having an insulator material located on one of its surfaces and a silicon-containing material formed on top of said insulator material.

5. The method of claim 4 wherein said bonded SOI structures includes one interface between the silicon-containing substrate and the insulator material and a second interface between the insulator material and the silicon-containing material.

6. The method of claim 1 wherein said bonded SOI structure comprises a Si substrate, a layer of $SiO_2$ formed thereon and a layer of Si formed on the $SiO_2$ layer.

7. The method of claim 2 wherein said absorbing material is a metallic material or a semiconductor material.

8. The method of claim 7 wherein said metallic material is selected from the group consisting of Al, Cu, Cr, W, and Ti.

9. The method of claim 8 wherein said metallic material is Al.

10. The method of claim 7 wherein said semiconductor material is Ge or GaSb.

11. The method of claim 2 wherein said layer of absorbing material has a thickness of from about 2 to about 100 nm.

12. The method of claim 11 wherein said layer of absorbing material has a thickness of from about 5 to about 40 nm.

13. The method of claim 2 wherein said laser light is a pulse of light having a wavelength of from about 100 to about 10,000 nm.

14. The method of claim 13 wherein said laser light is a pulse of light having a wavelength of from about 200 to about 1000 nm.

15. The method of claim 2 wherein said laser light is pulsed at an energy of from about 0.001 to about 10,000 nJ and at a repetition rate of from about 0.001 to about 1000 MHZ.

16. The method of claim 15 wherein said laser light is pulsed at an energy of from about 0.1 to about 10 nJ and at a repetition rate of from about 1 to about 100 MHZ.

17. The method of claim 2 wherein said change of optical parameter is a change of reflectivity of said absorbing material which is measured using a second pulse of laser light.

18. The method of claim 17 wherein said second pulse of laser light has a wavelength of from about 100 to about 10,000 nm.

19. The method of claim 18 wherein said second pulse of laser light has a wavelength of from about 200 to about 1000 nm.

20. The method of claim 17 wherein said second pulse of laser light has an energy of from about 0.001 to about 10,000 nJ.

21. The method of claim 20 wherein said second pulse of laser light has an energy of from about 0.1 to about 10 nJ.

22. The method of claim 1 or 3 wherein said oxide cap layer is formed in a gas mixture containing from about 10 to about 90% $O_2$ and the remainder being an inert gas.

23. The method of claim 22 wherein said oxide cap layer is formed by heating at a temperature of from about 900° to about 1200° C. for a time period of from about 10 minutes to about 4 hours.

24. The method of claim 23 wherein said oxide cap layer is formed by heating at a temperature of from about 1000° to about 1100° C. for a time period of from about 30 to about 60 minutes.

25. The method of claim 22 wherein said oxide cap layer has a thickness of from about 20 to about 200 nm.

26. The method of claim 25 wherein said oxide cap layer has a thickness of from about 50 to about 100 nm.

27. The method of claim 1 wherein said annealing is conducting in a gas mixture containing from about 0.2 to about 5% $O_2$ and the remainder being an inert gas.

28. The method of claim 27 wherein said annealing is conducting in a gas mixture containing from about 0.5 to about 2% $O_2$ and the remainder being an inert gas.

29. The method of claim 27 wherein said annealing is conducted at a temperature of from about 1250° to about 1375° C. and for a time period of from about 2 to about 24 hrs.

30. The method of claim 29 wherein said anneal is conducted at a temperature of from about 1300° to about 1320° C. and for a time period of from about 5 to about 10 hrs.

31. A method to detect the bonding imperfections at a silicon/insulator interface comprising the steps of:

(a) providing a bonded silicon on insulator (SOI) structure;

(b) depositing a layer of a material capable of absorbing laser light on a silicon-containing surface of said bonded SOI structure;

(c) pulsing the surface of the structure provided in step (b) with laser light under conditions effective to form a strain pulse which is transmitted through the structure until it reaches an interface, wherein at said interface a portion of said strain pulse is reflected back to the surface of said structure and the reminder of said strain pulse is transmitted through said interface; and (d) evaluating the change of an optical parameter of said partially reflected strain pulse.

* * * * *